United States Patent [19]

Narayan et al.

[11] 4,181,538

[45] Jan. 1, 1980

[54] METHOD FOR MAKING DEFECT-FREE ZONE BY LASER-ANNEALING OF DOPED SILICON

[75] Inventors: Jagdish Narayan, Knoxville; Clark W. White, Oak Ridge; Rosa T. Young, Knoxville, all of Tenn.

[73] Assignee: The United States of America as represented by the United States Department of Energy, Washington, D.C.

[21] Appl. No.: 945,925

[22] Filed: Sep. 26, 1978

[51] Int. Cl.$^2$ .................. H01L 21/26; H01L 21/268
[52] U.S. Cl. ...................... 148/1.5; 148/187; 219/121 L; 357/91
[58] Field of Search ............ 148/1.5, 187; 357/18, 357/91; 219/121 L

[56] References Cited

U.S. PATENT DOCUMENTS

| | | | |
|---|---|---|---|
| 3,458,368 | 5/1966 | Haberecht | 148/175 |
| 3,725,148 | 4/1973 | Kendall | 148/186 |
| 3,940,289 | 2/1976 | Marquardt et al. | 148/1.5 |
| 4,059,461 | 11/1977 | Fan et al. | 148/1.5 |
| 4,116,719 | 9/1978 | Shimizu et al. | 148/1.5 |

OTHER PUBLICATIONS

Krynicki et al., "Laser Annealing . . . Implanted Si", Phys. Letts. 61A, (May 1977), 181.
Kachurin et al., "Annealing . . . by Pulsed Laser . . .", Ion Impln. in S/C, 1976 ed., Chernow et al., Plenum, N.Y. 1977, p. 445.
Geiler et al., ". . . Laser . . . As Implanted Si", Phys. Stat. Sol. 41a (1977), K–171.
Kutukova et al., "Laser Annealing of . . . Si", Sov. Phys. Semicond. 10, (Mar. 1976), 265.
Foti et al., ". . . Laser Annealing . . . Si . . .", Appl. Phys. 15, (Apr. 1978), 365.
Kirkpatrick et al., "Si Solar Cells . . . Pulsed Energy . . .", 12th IEEE Photovoltaic Spec. Conf. Nov. 1976, p. 299.
Young et al., "Laser Annealing . . . Si", Appl. Phys. Letts. 32, (Feb. 1978), 139.
Kachurin et al., ". . . Scanning Laser Beam", Sov. Phys. Semicond. 10, (Oct. 1976), 1128.
Battaglin et al., ". . . Laser Annealing . . . P-implanted Si", Phys. Stat. Sol. 49a, (Sep. 1978), 347.
Kachurin et al., "Annealing . . . Laser Radiation Pulses", Sov. Phys. Semicond. 9, (1976), 946.
Antonenko et al., ". . . Impurity in Si . . . Laser Annealing", Sov. Phys. Semicond. 10, (Jan. 1976), 81.
Grindberg et al., "Absorption . . . S/C", Sov. Phys.-Sol. State 9 (1967), 1085.
Shtyrkov et al., ". . . Laser Annealing . . . Doped . . . Layers", Sov. Phys. Semicond. 9 (1976), 1309.
Khaibullin et al., "Utilization Coeff . . . Laser . . .", Sov. Phys. Semicond. 11, (Feb. 1977), 190.
Kachurin et al., "Diffusion . . . Laser . . . Implanted Layers", Sov. Phys. Semicond. 11 (Mar. 1977), 350.

*Primary Examiner*—L. Dewayne Rutledge
*Assistant Examiner*—Upendra Roy
*Attorney, Agent, or Firm*—R. V. Lupo; Stephen D. Hamel; Fred O. Lewis

[57] ABSTRACT

This invention is a method for improving the electrical properties of silicon semiconductor material. The method comprises irradiating a selected surface layer of the semiconductor material with high-power laser pulses characterized by a special combination of wavelength, energy level, and duration. The combination effects melting of the layer without degrading electrical properties, such as minority-carrier diffusion length. The method is applicable to improving the electrical properties of n- and p-type silicon which is to be doped to form an electrical junction therein. Another important application of the method is the virtually complete removal of doping-induced defects from ion-implanted or diffusion-doped silicon substrates.

9 Claims, 13 Drawing Figures

$^{63}$Cu$^+$(150 keV, 6.9 × 10$^{15}$/cm$^2$) in 111 Si

$^{11}$B(35 keV, 1×10$^{15}$) in Si

METHOD FOR MAKING DEFECT-FREE ZONE BY LASER-ANNEALING OF DOPED SILICON

This invention was made in the course of, or under, a contract with the United States Department of Energy. The invention relates broadly to methods for annealing n-type and p-type silicon to improve its quality with respect to semiconductor applications. More particularly, the invention relates to the use of relatively high-power laser pulses to effect such improvement by localized melting.

As applied to n-type and p-type silicon bodies which have been doped with an impurity to form an electrical junction therein, the invention effects a significant improvement in the electrical parameters of the junction by eliminating doping-induced defects. For instance, the invention may be used to remove lattice defects generated by high-voltage ion implantation techniques. In another application, it may be used to electrically activate "dead layers" produced by conventional high-temperature-diffusion doping. In a third application, it may be used to remove electrically inactive precipitates and lattice defects from n-type and p-type silicon before it is doped to form an electrical junction therein. Again, it may be used for segregating impurities such as copper and iron in a near-surface region of a semiconductor material. The impurities so segregated then may be removed from the material.

BACKGROUND OF THE INVENTION

The most widely used process for the production of an electrical junction in silicon is high-temperature diffusion of boron into an n-type substrate or phosphorus into a p-type substrate. It is well known that such diffusion usually results in a "dead layer" of electrically inactive dopant precipitates. Thus, the diffused layer contains a region (the dead layer) which is characterized by an extremely short minority carrier lifetime. High-temperature diffusion of dopants also generates dislocations and dislocation loops in the diffused layer, and these imperfections adversely affect important electrical characteristics of the junction. Hitherto, there has been no effective method for annealing the diffused layer to electrically activate dopant atoms in the precipitates and remove dislocations and dislocation loops. The present invention meets this need.

Another conventional process for producing an electrical junction in an n-type or p-type silicon substrate is ion implantation, where the dopant is deposited by directing a high-density, high-energy beam of dopant ions into the substrate. Unfortunately, the energetic ions damage the crystal lattice, and most of the dopant ions are not electrically active because they are not in substitutional lattice positions. It has been the practice to thermally anneal the implanted layer to remove the damage and electrically activate the dopant, but such annealing does not completely remove the lattice damage. Furthermore, it leads to precipitation of dopants and contaminants in the implanted layer and to generation of impurity-related defects, all of which degrade various electrical properties, such as the minority-carrier lifetime. The present invention can be used to anneal ion-implantation layers much more effectively.

Various publications describe the laser treatment of n-type and p-type silicon. The following are examples of articles relating to the laser-annealing of ion-implanted silicon substrates: (1) E. I. Shtyrkov et al, "Local Laser Annealing of Implantation Doped Semiconductor Layers," Sov. Phys. Semicond., Vol. 9, No. 10 (October 1975); (2) I. B. Khaibullin et al, "Utilization Coefficient of Implanted Impurities in Silicon Layers Subjected to Subsequent Laser Annealing," Sov. Phys. Semicond., Vol. 11, No. 2 (February 1977); (3) G. A. Kachurin et al, "Diffusion of Impurities As a Result of Laser Annealing of Implanted Layers," Sov. Phys. Semicond., Vol. 11, No. 3 (March 1977). The following are examples of United States patents which relate to the laser-treatment of silicon: U.S. Pat. No. 3,458,368, "Integrated Circuits and Fabrication Thereof," R. R. Haberecht, July 29, 1969; U.S. Pat. No. 3,940,289, C. L. Marquardt et al, "Flash Melting Method for Producing New Impurity Distribution in Solids," Feb. 24, 1976; U.S. Pat. No. 4,059,461, "Method for Improving Crystallinity of Semiconductor Films by Laser Beam Scanning and Products Thereof," J. C. Fan et al, Nov. 22, 1977.

So far as is known, hitherto there has been no laser-annealing technique which achieves virtually complete removal of doping-induced defects from silicon without at the same time degrading the electrical properties (e.g., the minority-carrier diffusion length) of the substrate. For instance, previous investigations of treating ion-implanted silicon with a laser failed to realize that the mechanism of melting can be used to achieve complete removal of defects without degrading electrical properties of the silicon.

OBJECTS OF THE INVENTION

It is an object of this invention to provide a method for laser-annealing diffused layers produced by the high-temperature diffusion of dopants into n-type or p-type silicon substrates.

It is another object to provide a method for laser-annealing n-type or p-type silicon containing grown-in defects, the annealing being effected with at least one laser pulse whose wavelength, energy density and duration comprise a novel and highly effective combination of silicon-melting parameters.

It is another object to provide a rapid method for segregating undesired impurities such as copper and iron in a near-surface region of silicon semiconductor material, thus facilitating subsequent removal of the impurities from the material.

SUMMARY OF THE INVENTION

One form of our invention may be summarized as follows: In a process wherein a surface of a crystalline silicon substrate is doped with a thermally diffused impurity to form an electrical junction therein, thereby generating doping-induced defects in a surface layer of said substrate, the improved method for removing said defects without degrading the minority-carrier diffusion length in said substrate, comprising:

irradiating said layer with at least one laser pulse selected from one of (a) Q-switched ruby laser-generated pulses having a wavelength of 0.694 μm, an energy density in the range of from about 1.5 to 3.0 J/cm$^2$, and a duration in the range of from about 20 to 50 nanoseconds and (b) Q-switched YAG laser-generated pulses having a wavelength of 1.06 μm, an energy density in the range of from about 5 to 7 J/cm$^2$, and a duration in the range of from about 80 to 120 nanoseconds to effect melting of said layer.

BRIEF DESCRIPTION OF THE FIGURES

FIG. 1 comprises two electron micrographs.

FIG. 3 is a series of bright-field transmission electron micrographs.

FIG. 5 is a series of bright-field transmission micrographs of a phosphorus-diffused silicon layer irradiated with superimposed laser pulses in accordance with this invention.

DESCRIPTION OF THE PREFERRED EMBODIMENT

This method of annealing is applicable to the removal of various defects present in surface layers of n- or p-type silicon crystals. The crystal may or may not contain an electrical junction. As used herein, the term "defects" includes both lattice imperfections (e.g., dislocations and dislocation loops) and electrically inactive dopant precipitates. As applied to a body of semiconductor material, the term "surface layer" is used herein to mean a layer thereof which extends inward from a surface of the body for a distance of less than five microns. The term "removing defects" includes (1) the elimination of lattice imperfections and (2) the dissolution of precipitated dopant atoms into the silicon.

An important feature of our invention is to effect annealing by melting essentially all of the silicon layer containing doping-induced defects—e.g., radiation-bombardment-generated defects in the case of ion-implanted substrates. Another feature is that melting is accomplished with one or more laser pulses, each of which has a wavelength, energy density, and duration selected to melt the silicon effectively to the desired depth while avoiding degradation of electrical parameters in the substrate. For example, using a Q-switched ruby laser we employ laser pulses with a wavelength of 0.694 μm, an energy density of from about 1.5 to 3.0 J/cm$^2$, and a duration of from about 20 to 50 nanoseconds. We have found, for instance, that a laser pulse having a wavelength of 0.694 μm, an energy density of 1.6 J/cm$^2$, and a duration of 50 nanoseconds will melt an amorphous silicon substrate to a depth of 4000 Å. If desired, the depth of melting can be increased by increasing the energy density of the laser pulse. Alternatively, a relatively small increase in the depth of the melting may be achieved by using multiple pulses or decreasing the pulse duration, while remaining within the above-specified ranges. In the typical application of this invention, the depth to which the doping-induced defects have extended is determined by any suitable technique, such as ion back-scattering. The pulse melting parameters then are selected accordingly to effect melting to substantially that depth. (In some applications, such as those relating to certain conventional deep-junction devices, melting beyond that depth may be desirable.) As an alternative to the Q-switched ruby laser, a Q-switched YAG laser may be employed (wavelength, 1.06 μm; pulse duration in the range of about 80–120 nanoseconds; energy density in the range of about 57 τ/cm$^2$). Given the teachings below, one versed in the art can determine by only routine experimentation which values within the aforementioned ranges are the optimum for effecting melting to the selected depth.

EXAMPLE 1

Laser-Annealed Ion-Implanted Silicon

The starting material for this experiment comprised conventional (100) single-crystal wafers of n-type silicon. The wafers (2×1 cm×1 mm thick) were sliced from an 80 Ω/cm, dislocation-free, floating-zone ingots. After degreasing and drying, the wafers were chemically polished in CP-6 solution (HF:CH$_3$COOH:NHO$_3$=1:1:2). The wafers then were rinsed in deionized water and dried. Following drying, the wafers were implanted with boron under conventional conditions. That is, they were implanted under high vacuum ($2\times10^{-8}$ torr) with $11_B+$ (35 KeV, $1.5\times10^{-6}$ amps cm$^{-2}$) in the range from $1\times10^{14}$ to $9\times10^{16}$ cm$^{-2}$. The wafers implanted at each dose were each split in half for comparative laser annealing and thermal annealing treatments. In accordance with this invention, part of the split samples were annealed with a single laser pulse to effect melting throughout the damaged layer—i.e., the region containing doping-induced defects. The damaged layer extended slightly beyond the dopant distribution. The laser annealing was conducted in air, using the Q-switched output of a conventional ruby laser (λ=0.694 μm; pulse duration, 30–50 nsec; energy density, 1.5–1.7 Joules/cm$^2$ per pulse). Thermal annealing was conducted in a quartz furnace, under a helium atmosphere. The samples were step annealed for thirty-minute periods at temperatures up to 1100° C.

Figure 1A:
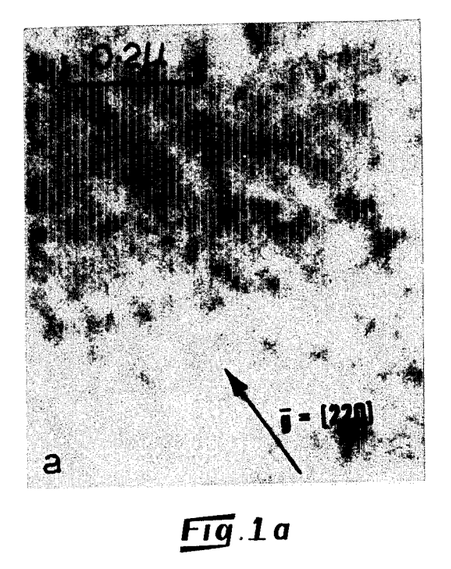
FIG. 1a is a view of an ion-implanted silicon specimen after laser-annealing in accordance with this invention, showing a complete annealing of defects.
Figure 1B:
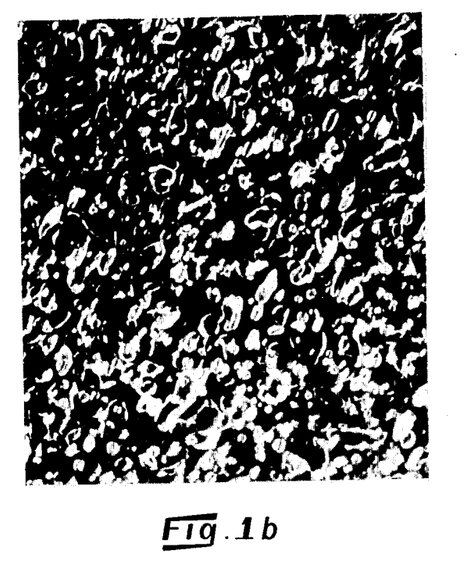
FIG. 1b is a view of a similar specimen which was not laser-annealed but rather thermally annealed at 900° C. for thirty minutes, showing a high density of residual damage in the form of dislocations and loops. The scale is shown, and arrows indicate the directions of diffraction vectors used.

Table 1 (below) compares the laser-annealed and thermally annealed samples in terms of carrier concentration (N$_s$), carrier mobility (μ), and sheet resistivity (ρ$_s$) in the implanted layer, as determined by van der Pauw measurements. The minority carrier diffusion length (L) in the annealed substrates was determined by surface-photovoltage measurements. In addition, the utilization coefficient (ratio of $N_s$ to the implanted dose D) is given. The table clearly shows that laser annealing under the conditions cited above provided better recovery of the electrical activity, with little or no degradation of the minority-carrier diffusion length. (As-received control samples—i.e., 80 Ω-cm material—had diffusion lengths in the range of 350–400 μm.) In marked contrast, thermal annealing at 900° and 1100° C. decreased the minority-carrier diffusion length significantly—i.e., by a factor of 5 or more. As shown, the carrier mobilities in the laser-annealed and the 1100° C. thermally annealed surface layers were in general agreement, allowing for a decrease of mobility with an increase in dopant concentration.

thermally annealed implanted specimens exhibited massive damage in the form of dislocation loops (average loop size, approximately 250 Å), with a dislocation-loop density of approximately $1.0 \times 10^{16}$ cm$^{-3}$, as shown in FIG. 1b. The complete removal of defects by the laser annealing is reflected in the comparative electrical measurements presented in Table 1.

The ion-implanted, laser-treated specimens subsequently were subjected to thermal annealing to study the clustering-point defects (single-vacancy or interstitial) and clusters thereof (if any) which might be below the microscope resolution (approximately 10 Å). No clusters of defects were observed in the specimens which were implanted with doses not exceeding the Table 1

| Sample No. | Implanted Dose (cm$^{-2}$) D | Laser Annealing (Ruby Laser) $\lambda = 0.694\mu$, $E = 1.5$–$1.7$ J/cm$^2 = 30$–$50$ns | | | | Thermal Annealing | | | | | | | | |
|---|---|---|---|---|---|---|---|---|---|---|---|---|---|---|
| | | | | | | 900° C./30 min. | | | | | 1100° C./30 min. | | | |
| | | $N_s$ cm$^{-2}$ | $\mu$ cm$^2$/v·s | $\rho_s$ Ω/□ | L μm | $N_s$ cm$^{-2}$ | $\mu$ cm$^2$/v·s | $\rho_s$ Ω/□ | L μm | $N_s/D$ | $N_s$ cm$^{-2}$ | $\mu$ cm$^2$/v·s | $\rho_s$ Ω/□ | L μm | $N_s/D$ |
| 1 | $1.0 \times 10^{14}$ | $9.9 \times 10^{13}$ | 94 | 670 | — | | | | | | | | | | |
| 2 | $4.2 \times 10^{14}$ | $5.0 \times 10^{14}$ | 54 | 230 | 340 | $3.2 \times 10^{14}$ | 64 | 307 | 80 | .76 | $3.3 \times 10^{14}$ | 80 | 238 | 45 | .79 |
| 3 | $1.0 \times 10^{15}$ | $1.5 \times 10^{15}$ | 41 | 102 | 295 | $6.5 \times 10^{14}$ | 53 | 179 | 70 | .65 | $9.2 \times 10^{14}$ | 59 | 116 | 40 | .92 |
| 4 | $5.0 \times 10^{15}$ | $7.5 \times 10^{15}$ | 35 | 24 | 275 | $1.3 \times 10^{15}$ | 42 | 114 | 70 | .26 | $4.4 \times 10^{15}$ | 45 | 31 | 45 | .88 |
| 5 | $1.0 \times 10^{16}$ | $1.5 \times 10^{16}$ | 31 | 13 | 350 | $1.6 \times 10^{15}$ | 39 | 103 | 75 | .16 | $9.4 \times 10^{15}$ | 38 | 18 | 35 | .94 |
| 6 | $2.5 \times 10^{16}$ | $3.8 \times 10^{16}$ | 30 | 4.3 | — | $4.2 \times 10^{15}$ | 30 | 51 | 70 | .17 | $1.4 \times 10^{16}$ | 40 | 11 | 30 | .56 |
| 7 | $6.0 \times 10^{16}$ | Surface Cracking* | | | | $4.7 \times 10^{15}$ | 24 | 57 | — | .08 | $1.5 \times 10^{16}$ | 39 | 11 | — | .25 |
| 8 | $8.0 \times 10^{16}$ | Surface Cracking* | | | | $4.7 \times 10^{15}$ | 23 | 58 | — | .06 | $1.4 \times 10^{16}$ | 35 | 11 | — | .18 |

*Observed after laser annealing

To compare the damage remaining in boron-implanted silicon samples subjected to laser and thermal annealing, studies were made using transmission electron microscopy (TEM) and 1 MeV He+ ion backscattering. Samples for the TEM studies were prepared in the form of disks (3 mm diameter by 0.75 mm thick), using an ultrasonic cutter. These samples were dished from the back side in the center (1 mm diam.) to a depth of approximately 0.25 mm. Chemical polishing was used to remove any plastic damage. Nine such samples were implanted on the front side $11_B+$ (35 KeV, $3 \times 10^{15}$ ions cm$^{-2}$). Six of the samples then were laser-annealed under the above-specified conditions, and the remaining samples were thermally annealed at 900° C. for 30 min. The annealed samples then were chemically thinned from the dished side.

Electron micrographs of the annealed samples just described were taken under both bright- and dark-field (weak beam) imaging conditions for optimum visibility and contrast from defects. The thickness of the areas examined in the microscope varied from 0 to 5000 Å (angstroms). In a typical instance the thickness of the area shown in the micrograph was 2000 Å, which thickness included the peak-damage position (800 Å) as well as the projected range of the ions (approximately 1150 Å). As shown in FIG. 1a, 1 no damage in the form of dislocations, stacking faults, and dislocation loops was observed. A [100] electron-diffraction pattern showed no irregularity, confirming the perfection of the lattice of the implanted layer after laser annealing as described. (Similar results were obtained with unimplanted silicon wafers of the kind described above. That is, when unimplanted n-type wafers were laser-annealed under the same conditions as those employed with the boron-implanted wafers, micrographs showed removal of essentially all of the grown-in precipitates and lattice imperfections present in the unimplanted silicon.) In contrast to the laser-annealed implanted specimens, the equilibrium solid solubility limits. Electrical measurements of these specimens showed no change in carrier concentration.

In the specimens implanted with doses above the equilibrium solid solubility limit, thermal annealing of the laser-irradiated specimens led to precipitation of dopants. The decrease in carrier concentration could be correlated with the number of dopant atoms in the precipitates. These observations strongly suggest that there are no significant concentrations of defects (below the microscopic resolution) left after the laser treatment. One further advantage of laser annealing was that no dislocations were present near the junction due to the relaxation of strains produced by the implanted ions. This is in contrast to thermally annealed specimens, where the strain relaxation produces a network of dislocations near the junction, acting as recombination centers during operation of the device.

Figure 2:
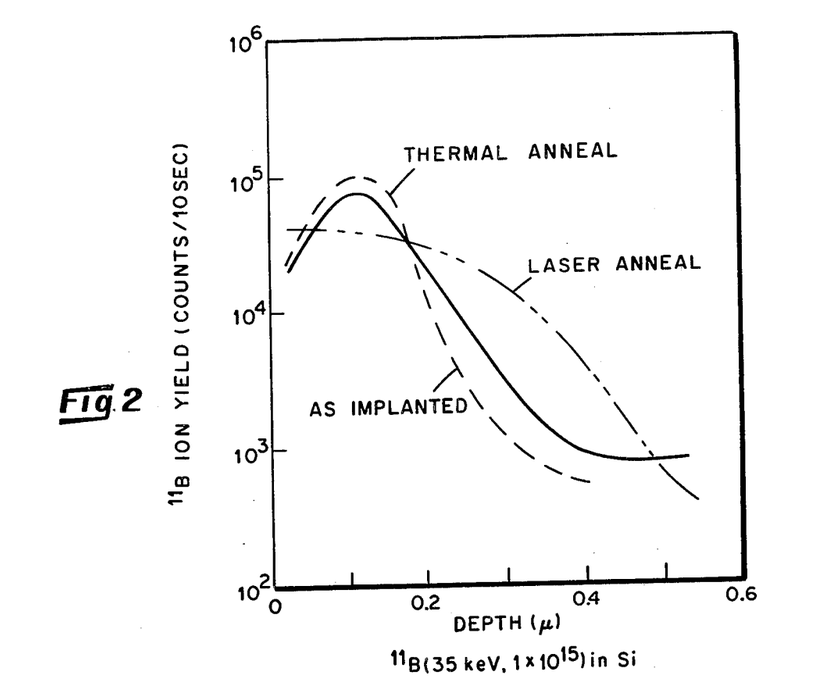
FIG. 2 is a graph showing boron-distribution profiles for silicon wafers (a) as-implanted with boron, (b) after thermal annealing in conventional fashion, and (c) after laser annealing in accordance with this invention.

FIG. 2 shows the boron-distribution profiles for the samples discussed above. That is, profiles are shown for (a) as-implanted samples, (b) implanted and thermally annealed samples, and (c) implanted and laser-annealed samples. The data for FIG. 2 are based on secondary-ion mass spectrometry. As shown, the laser annealing effected pronounced changes in the implanted profile distribution. The nearly Gaussian as-implanted boron profile became almost uniform from the surface down to a depth of approximately 1800 Å, and the profile broadened to a greater depth.

Using conventional techniques, solar cells were fabricated from silicon samples which had been laser-annealed in accordance with the invention. The cells were provided with three-layer Cr-Ti-Ag or Ti-Pd-Ag contacts. Silicon nitride or tantalum oxide (approximately 600 Å thick) were used as anti-reflection coating materials. Table 2 presents important parameters for these cells. The cell efficiency (14.5%, one-sun) is only slightly lower than those reported to date (approximately 16.1%) using the best conventional dopant-diffusion techniques and is much better (by a factor of 2) than that obtained by conventional thermal annealing of ion-implanted silicon. Further improvement in ion-implanted, laser-annealed solar cells can be expected by making shallower profiles and using back-surface fields.

EXAMPLE 2

Laser-Annealed Boron-Diffused Silicon Substrates

In this experiment the starting material comprised n-type (100) slices cut from a 5 $\Omega$/cm phosphorus-doped, dislocation-free, float-zone silicon ingot. The wafers measured $2 \times 1$ cm$\times 0.5$ thick. After degreasing and rinsing, the wafers were chemically polished in CP-6 solution. Boron diffusions were carried out in Table 2

| Cell No. | Junction Formation | Minority Carrier Lifetime in base material* $\tau(\mu s)$ | Jsc(mA/cm$^2$) | AM 1 Parameters** Voc(mV) | FF | $\eta$(%) |
|---|---|---|---|---|---|---|
| 1L 2 | $^{11}$B$^+$ implant laser anneal (1.7 J/cm$^2$) | 90 | 35 | 570 | .72 | 14.5 |
| 1T 1 | $^{11}$B$^+$ implant thermal anneal 900° C./30 min | 5 | 13.7 | 465 | .65 | 4.2$^+$ |
| 1T 2 | $^{11}$B$^+$ implant thermal anneal 1000° C./30 min | 2.6 | 15.6 | 445 | .61 | 4.4$^+$ |
| D 1 | Boron diffusion 950° C./30 min | 7 | 21.7 | 525 | .66 | 7.5$^+$ |

*Measured by surface photovoltage measurement.
**Tungsten lamp calibrated at approximately 100 mW/cm$^2$.
$^+$ No antireflection coating (such a coating improves the efficiency by about 35%).

Still referring to Table 2, the improvement in open-circuit voltage $V_{oc}$ is believed due to the more complete annealing of the implanted surface layer. The improved $J_{sc}$ is believed due to the longer minority-carrier lifetime in the substrate and implanted layer. The data clearly show that the redistribution of dopants cannot be explained by thermal diffusion in the solid. The altered profiles were in good agreement with the theoretical calculations if it was assumed that the diffusion occurred in the liquid phase. The alteration in the profile was found to be dependent on both the pulse energy and the number of superimposed pulses. Measurements of quantum energy as a function of wavelength showed significant improvement in quantum response (electrons collected per incident photon) at all wavelengths. The improvement in the red region approached 70%; in the blue region it reached 25%.

In summary, although the ion-implanted samples were not optimized to provide maximum solar-cell performance, they exhibited one-sun conversion efficiencies much superior to those for the thermally annealed samples and comparable to those obtained with cells fabricated by standard high-temperature diffusion techniques. The increased activity of the laser-annealed samples correlated well with the great reduction in radiation-induced damage effected by laser annealing. In the past, ion implantation has not been favored as a technique in the production of solar cells because the subsequent thermal-annealing operation resulted in a very low-efficiency cell. With the present invention, ion implantation can be utilized to make solar cells of much higher efficiency.

Experiments similar to the above (laser-annealing and fabrication of solar cells) have been conducted with p-type silicon substrates implanted with one of the following dopants: phosphorus, arsenic, and antimony, in float-zone and Czochralski silicon (1–8 $\Omega$-cm). These experiments also demonstrate that laser annealing to effect melting of the region containing radiation-induced defects resulted in junctions whose electrical parameters were significantly better than those of comparable samples which were thermally annealed.

conventional fashion—i.e., in an argon atmosphere with an induction furnace using a split graphite susceptor impregnated with B$_2$O$_3$. The diffusion conditions comprised 1100° C. for 10 min, 950° C. for 30 min, or 900° C. for 50 min. As will be described in Example 3, other wafers were diffusion-doped with phosphorus in conventional fashion, at 1100° C. for 60 min, using a PH$_3$ source.

In accordance with the invention, the resulting boron-doped silicon substrates were laser-annealed to effect melting throughout the diffused (boron-doped) layer to remove doping-induced defects therein—i.e., to eliminate dislocation loops and to dissolve and electrically activate dopant atoms in the dead layer (see above). The laser treatment was effected with the Q-switched output of a standard ruby laser (wavelength, 0.694 $\mu$m; energy density, 1.5–1.8 J/cm$^2$/pulse; pulse duration, approximately 50 nsec). The depth, or thickness, of the diffusion layer was determined by examining representative samples by means of stereoscopic electron-microscopy techniques. The typical diffused layer extended to a depth of 200 A.

The carrier concentration (N$_s$), carrier mobility ($\mu$), and sheet resistivity ($\rho_s$) for the annealed wafers were determined by van der Pauw measurements. The dark-IV characteristics were measured on small mesa diodes (area, $1.115 \times 10^{-3}$ cm$^2$), with an evaporated aluminum front contact and an electrolessly deposited nickel back contact. Transmission electron microscopy (TEM) studies were conducted with TEM-200 C and Hitachi 200 E electron microscopes.

Table 3 presents the results of van der Pauw measurements for the boron-diffused wafers before and after laser annealing. The results show clearly that the free-carrier concentration was increased considerably by the laser treatment. Moreover, the carrier concentrations near the surface on laser-treated samples D2 and D3 were $1.0 \times 10^{21}$ and $1.5 \times 10^{21}$ cm$^{-3}$, respectively, as determined by anodic oxidation and stripping techniques. These values are much higher than the solubility limit of boron in silicon. This increase in carrier concentration indicates that the electrically inactive precipitates in the diffused samples were dissolved into substitutional sites by the laser annealing.

Table 3

| Sample | Diffusion Temperature and Time | Before Laser Treatment | | | After Laser Treatment | | |
|---|---|---|---|---|---|---|---|
| | | $N_s$ (cm$^{-2}$) | $\rho_s$ ($\Omega/\square$) | $\mu$ (cm$^2$v·s) | $N_s$ (cm$^{-2}$) | $\rho_s$ ($\Omega/\square$) | $\mu$ (cm$^2$v·s) |
| D1 | 900° C./50 min | 2.1 × 10$^{15}$ | 77 | 39 | 1.4 × 10$^{16}$ | 13.0 | 31 |
| D2 | 950° C./30 min | 3.8 × 10$^{15}$ | 44 | 38 | 2.5 × 10$^{16}$ | 8.6 | 29 |
| D3 | 1000° C./10 min | 5.8 × 10$^{15}$ | 28 | 38 | 3.4 × 10$^{16}$ | 6.3 | 30 |

Figure 3A:
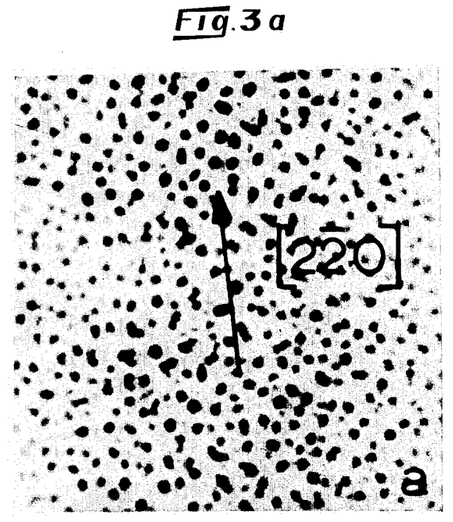
FIG. 3a shows dopant precipitates in boron-diffused silicon.
Figure 3B:
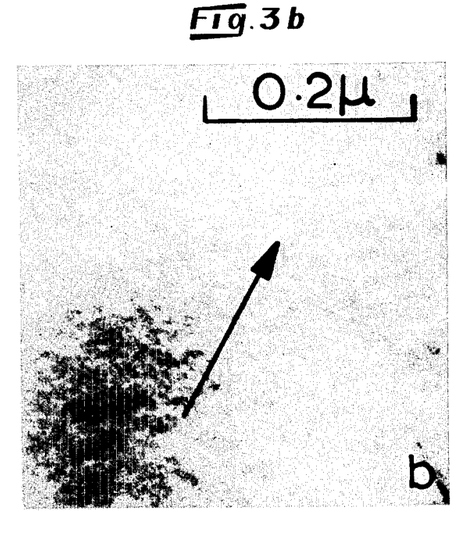
FIG. 3b shows the same region after laser annealing in accordance with this invention.
Figure 3C:
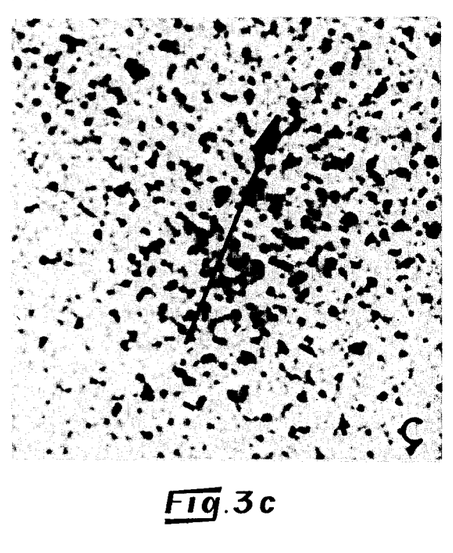
FIG. 3c shows the laser-annealed region after being heat-treated in conventional fashion.

The dissolution of the precipitates was confirmed by TEM studies. FIG. 3a is a micrograph illustrating the precipitates observed in Sample D2 near the surface, in the as-diffused condition. The generally spherical precipitates exhibit black-white contrast characteristics which are expected from boron precipitates. The average size (third moment of the diameter) and the number density of the precipitates were determined to be 97.4 A and 3.2×10$^{11}$ cm$^{-2}$, respectively. From stereomicroscopy it was found that the precipitates were contained in the first 200-A thick layer. As illustrated in FIG. 3b, laser treatment in accordance with this invention virtually eliminated doping-induced defects; that is, no precipitates or other defects (e.g., dislocation loops) were observed. The number of density of boron atoms contained in the precipitates was estimated to be (1.85±0.25)×10$^{16}$ cm$^{-2}$. If it is assumed that all precipitates were dissolved during laser treatment and that the boron atoms were electrically activated, then the electrically active boron concentrations after laser annealing should have been (2.23±0.25)×10$^{16}$ cm$^{-2}$. The electrical measurements (Sample D2, Table 2) were in good agreement with this value.

Since the near-surface free-carrier concentration after laser annealing was much greater than the equilibrium solubility limit of boron in silicon, annealed Sample D2 was heated to 950° C. for 30 min to study the reprecipitation of boron. As indicated in FIG. 2c, the result was a distribution of generally spherical particles whose average size (third moment of the diameter) was determined to be 61 A. Black-white dynamic dark-field conditions indicated that the precipitates were centers of compression, as expected for boron precipitates. The amount of boron contained in these precipitates was 90% of that present in the as-diffused sample (FIG. 3a). Stereomicroscopy established that these precipitates were distributed almost uniformly up to 4500 A from the surface. These findings support the conclusion that the surface layer containing doping-induced defects was melted to about 4500 A by the laser pulse.

Figure 4:
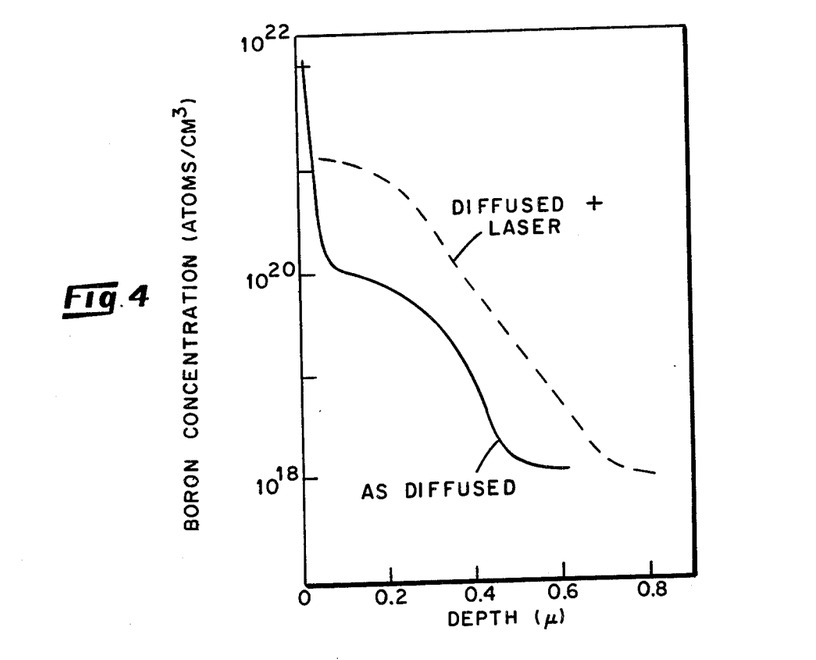
FIG. 4 is a graph comparing the boron-distribution profiles for an as-diffused boron-doped specimen and the same specimen after annealing in accordance with the invention.

FIG. 4 is a boron-dopant profile of Sample D3 (Table 3), measured before and after laser annealing. As also observed by TEM, the high density of boron concentration is near the surface in the as-diffused sample, in the form of precipitates. As shown, the profile distribution was altered considerably by the laser treatment, the dead layer having been removed and the dopant redistributed farther into the crystal. This result, too, supports the conclusion that the surface layer containing the doping-induced defects was melted by the laser-annealing operation. Studies based on secondary ion mass spectrometry and ion backscattering showed that the alteration in boron distribution was dependent on the individual pulse energy and the number of superimposed pulses.

The influence of the laser annealing on the junction characteristics of the boron-diffused samples was examined before and after laser treatment. In both instances, the small mesa diodes followed closely the ideal diode equation $$I = I_o[\exp \frac{qV}{AkT} - 1]$$

in the region of applied bias of 0.20 to 0.55 V. However, the diode perfection factor A in this region was improved from 1.5±0.1 to 1.2±0.1 by the laser annealing, indicating that recombination effects were decreased in the space-charge region.

Solar cells were fabricated from slices of boron-diffused Sample D2 (Table 3). The cells were provided with aluminum front contacts and electroless-nickel back contacts but were not provided with antireflection coatings, special texturized front surfaces, or drift-field back contacts. Laser annealing increased the $J_{sc}$ parameter from an original value of 17.5 mA/cm$^2$ to 19.4. the $V_{oc}$ parameter was increased from an original value of 520 mV to 540.

In summary, our method can be used to anneal diffusion-induced defects in the same manner as to anneal radiation-induced damage. That is, we anneal with one or more laser pulses, each having a wavelength, energy density and duration effecting melting throughout the surface layer containing doping-induced defects. More specifically, we anneal with pulses whose wavelength duration, and energy level are in the above-specified ranges for Q-switched ruby and YAG lasers. The depth of the layer containing doping-induced defects can be determined by any suitable technique, as by ion backscattering.

EXAMPLE 3

Laser-Annealed Phosphorus-Diffused Silicon Substrate

The starting material for this experiment was a p-type silicon wafer sliced from 15 Ω-cm (100) float-zone crystals. The resulting wafer was doped with phosphorus in conventional fashion—i.e., at 1100° C. for 60 min, with a PH$_3$ source. Precipitates (average size, 120 A; number density, 2.88×10$^{15}$ cm$^{-3}$) and dislocation loops (average size, 200 A; number density, 0.92×10$^{15}$ cm$^{-3}$) were observed. The precipitates exhibited strain contrast, analogous to compression centers. The dislocation loops were determined to be of the interstitial type. It was estimated from stereoscopic examination that the loops and precipitates were distributed inward from the surface to a depth of about one micron.

Figure 5A:
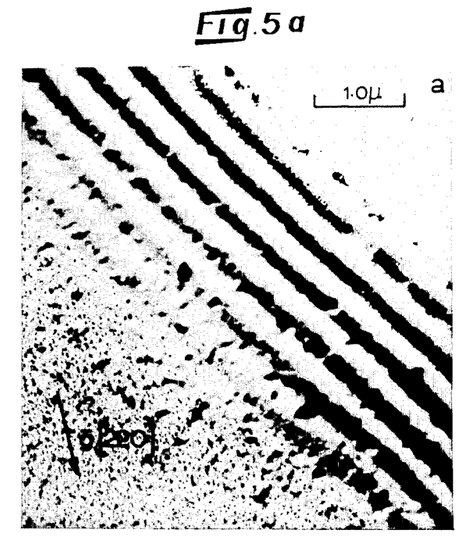
FIGS. 5a and 5b show the specimen after treatment with one and three pulses, respectively (pulse energy density 1.6 J/cm$^2$).
Figure 5B:
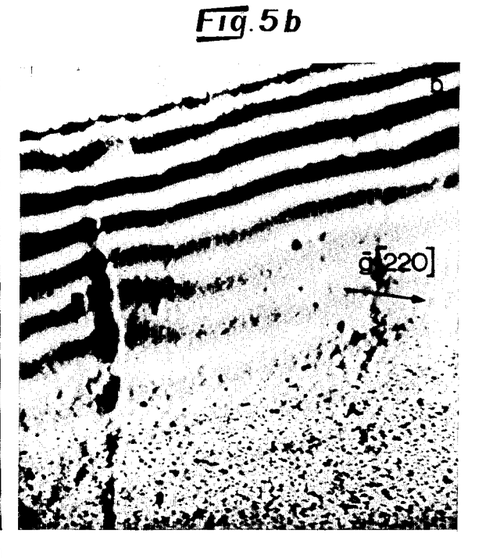
Figure 5C:
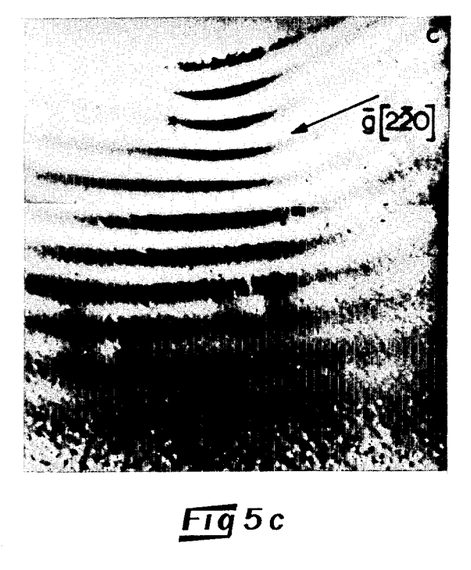
FIG. 5c shows the specimen after further laser treatment in accordance with the invention, as described in the text.

The phosphorus-diffused wafer was laser-annealed in accordance with this invention by irradiating the diffused layer with a series of laser pulses having a wavelength of 0.694 μm and a duration of 20 nanoseconds. As shown in FIG. 5a, one pulse of 1.6 J/cm$^2$ produced an annealed, defect-free region 0.55 μm deep. A second and similar pulse increased the depth of the defect-free region to 0.60 μm. After three such pulses the depth was determined to be 0.65 μm (FIG. 5b). Saturation in the depth of the annealed region was observed at 0.7

μm, after approximately five such pulses. The same region then was irradiated with a single pulse at an energy of 2.2 J/cm$^2$; this extended the annealed region to 0.9 μm (FIG. 5c). Complete annealing up to one micron was achieved by an additional laser pulse at 2.5 J/cm$^2$.

For phosphorus precipitates of average size 120 A, the time for dissolution by diffusion is estimated to be about 30 min (based on a diffusion coefficient of 10$^{-10}$ cm$^2$/sec at 1325° C.); the corresponding time for boron precipitates is estimated to be about 60 min. For dislocation loops in phosphorus-diffused specimens, the time required for dissolution is about 10 min. Since the time that the laser-irradiated substrate is hot ($\gtrsim$1300°–1400° C.) is of the order of 200×10$^{-9}$ sec, it is concluded that melting must be effected where diffusion coefficients are about 2.4×10$^{-4}$ cm$^2$/sec.

It will be apparent to those versed in the art that our method as exemplified in Examples 2 and 3 is generally applicable to the annealing of diffused layers. That is, it is applicable to the annealing of n-type silicon into which an acceptor impurity has been diffused, and of p-type silicon into which a donor impurity has been diffused. Also, as mentioned in Example 1, it will be apparent that our method is applicable to the removal of the precipitates or lattice imperfections present in p-type or n-type silicon which has not been doped to form an electrical junction therein. That is, melting in accordance with this invention can be used to improve the electrical properties of crystalline silicon before it is doped by conventional junction-forming techniques, such as ion-implantation or high-temperature diffusion.

As mentioned, our method is based on our finding that doping-induced defects may be essentially completely removed by irradiation with laser pulses selected to effect melting at least to the depth of the silicon layer containing the defects. Our method may be conducted with any suitable laser, such as a ruby laser or YAG laser, operated in the Q-switched mode. The laser may be operated in the multi-mode or the uniphase mode. Better results were obtained with the uniphase mode because of Gaussian distribution of intensity across the beam.

The following example demonstrates the feasibility of using high-power laser pulses having a wavelength, duration, and energy level in the above-specified ranges to effect melting of a surface layer of a body of silicon semiconductor material in order to effect segregation of certain impurities in a near-surface region. The resulting impurity-rich layer then may be removed from the body by any suitable technique. The segregation technique is applicable, for instance, to the purification of n- or p-type silicon which is to be doped to form an electrical junction therein.

EXAMPLE 4

Single crystals of silicon (5 Ω-cm, n type, Cz) with (111) orientation were used in this experiment. Implants ($^{63}$Cu$^+$, energy 150 KeV, dose 6.9×10$^{15}$ cm$^{-2}$) were performed at room temperature under high-vacuum conditions (2×10$^{-8}$ torr). The resulting implanted specimens wre irradiated with single pulses of a Q-switched ruby laser ($\lambda$=0.694 μm; pulse duration, $\tau$=50×10$^{-9}$ sec; pulse energy density, E$\approx$1.6 J cm$^{-2}$). Each specimen was divided for study by backscattering and electron microscopy techniques. Profiles of $^{63}$Cu$^+$ before and after the laser treatment were determined using 2.5 MeV He$^+$ ion backscattering in a high-depth resolution (30 A) scattering geometry. (The advantage of the high resolution case is increased sensitivity to detailed structure of the implanted impurity and to radiation damage profiles.) Channeling techniques were used to measure crystal perfection and to determine the lattice sites of dopant atoms. Specimens for transmission electron microscopy were prepared by a backthinning technique while protecting the implanted side.

Figure 6:
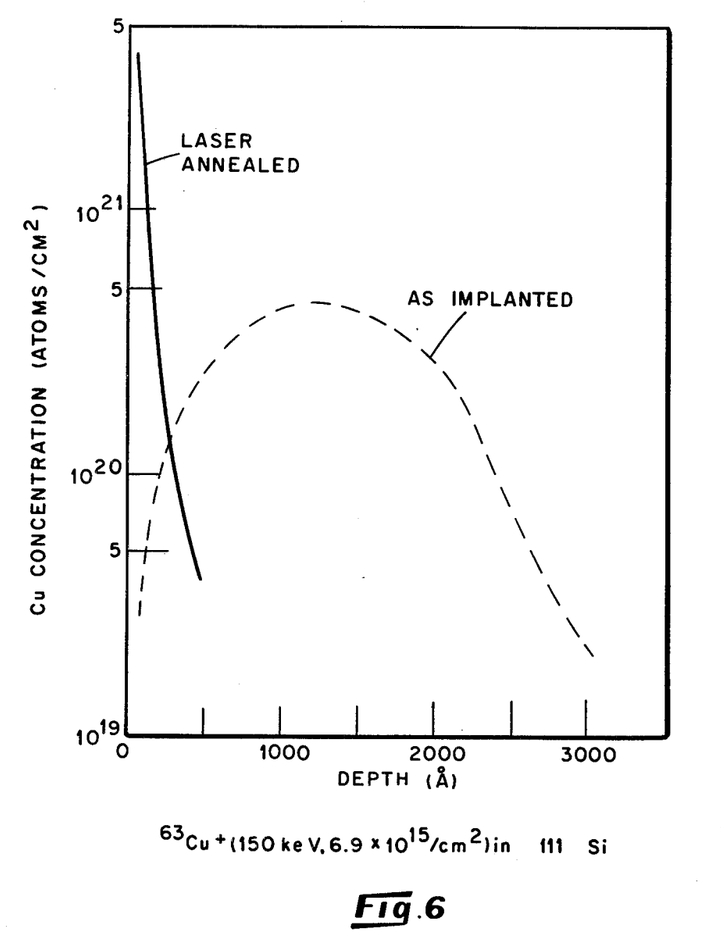
FIG. 6 is a graph presenting copper-concentration versus depth curves for a crystalline silicon body (a) after ion-implantation of copper and (b) after subsequent laser irradiation in accordance with this invention.

FIG. 6 shows the concentration of copper as a function of depth before and after laser irradiation. The as-implanted specimen concentration profile has a Gaussian shape with the peak at about 1100 A. As shown, the laser treatment effects a significant change in the concentration profile, most of the copper now being segregated within 200 A of the surface. The channeling results also indicated that a significant recovery of crystal damage had occurred after laser irradiation because dechanneling in the <110> direction gave a "minimum yield" value of x$_{min}$=5.7% compared to x$_{min}$=3% for the virgin crystals.

Figures 7, 8:
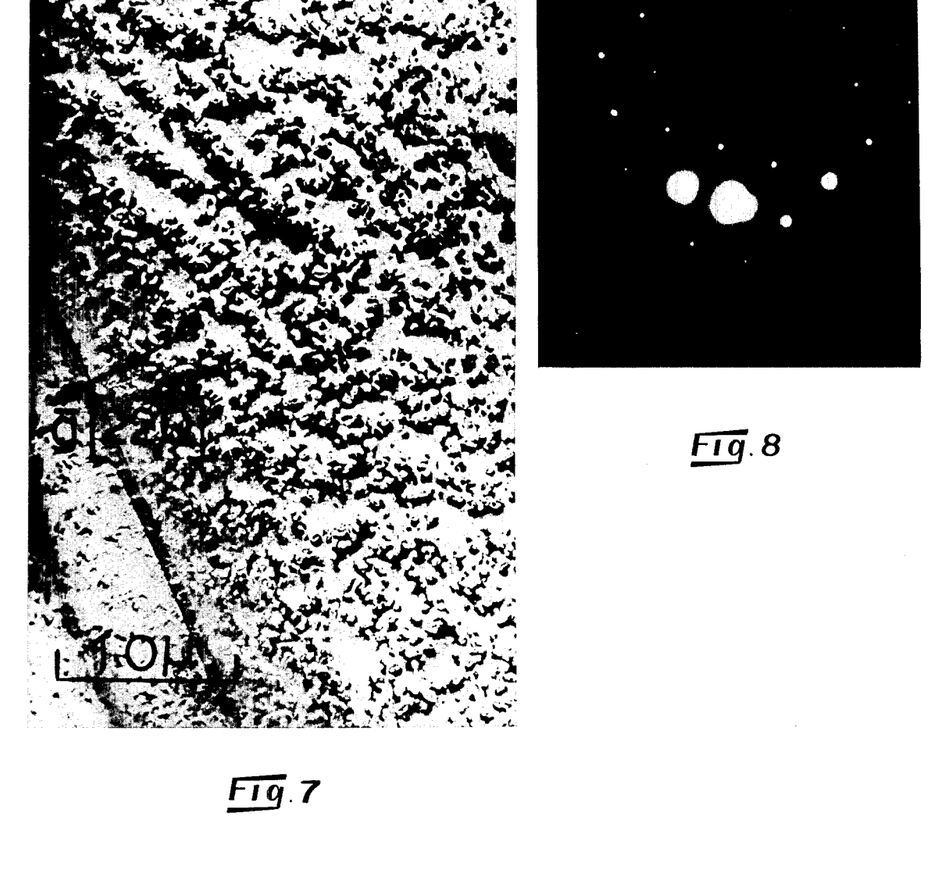
FIG. 7 is an electron-micrograph of a section of the above-mentioned ion-implanted, laser-irradiated specimen.
FIG. 8 is a selected-area diffraction pattern for the same specimen.

Electron-microscope results showed that the displacement damage created by copper ions in the as-implanted samples had caused the implanted layer to become amorphous. After laser treatment, residual damage in the form of dislocation tangles and precipitates (P) was observed as shown in FIG. 7. Stereo microscopic measurements indicated that the residual damage was largely contained in the first 200 A with precipitates extending to about 400 A. Below this depth a defect-free crystalline region was observed. The residual damage, as observed by electron microscopy, was compatible with the high x$_{min}$ values for these specimens. The dislocations were heavily decorated, presumably with copper silicide precipitates. Precipitates in the regions between the dislocations had average sizes (approx. 100 A) and exhibited black-white contrast under dynamical bright or dark field conditions. From the contrast behavior under both bright field and dark field conditions, these precipitates were tentatively identified as copper silicide ($\beta$-CuSi). Most of the copper was associated with precipitates near the dislocation tangles.

FIG. 8 is a selected area diffraction pattern showing that the implanted layer has crystallized in conjunction with the underlying (111) substrate. Similar results were obtained in the case of iron in silicon, where significant segregation of Fe to the surface was observed after the pulsed laser irradiation. For antimony in silicon, no precipitation was observed up to ion doses ($^{121}$Sb, 100 KeV) of 7×10$^{15}$ cm$^{-2}$; however, precipitation of dislocations contained within about 400 A from the surface was observed for doses exceeding 1×10$^{16}$ cm$^{-2}$.

As is known, Cu and Fe both have relatively low equilibrium distribution coefficients and solid solubility limits in silicon. Sb lies between (a) B, P and As (where no segregation is observed) and (b) Cu and Fe (where significant segregation is observed). Since a ruby laser pulse of E~1.6 J/cm$^2$ effects melting of silicon, it appears that the segregation of Cu and Fe near the surface may be the result of their low distribution coefficients and solubilities. In the process of solidifying molten silicon, the concentrations of Cu and Fe in the liquid far exceed those in the solid. Thus, we suggest that since the surface is the last region to solidify, segregation near the surface occurs. In many device applications involving silicon, Cu and Fe impurities act as very efficient recombination centers and adversely affect minority-carrier lifetime. Laser irradiation as described can be used as a rapid purification treatment to segregate these impurities near the surface, where they can be removed by light etching of the surface or by any other suitable technique.

What is claimed is:

1. In a process wherein a surface of a crystalline silicon substrate is doped with a thermally diffused impurity to form an electrical junction therein, thereby generating doping-induced defects in a surface layer of said substrate, the improved method for removing said defects without degrading the minority-carrier diffusion length in said substrate, comprising:
   irradiating said layer with at least one laser pulse selected from one of (a) Q-switched ruby laser-generated pulses having a wavelength of 0.694 μm, and energy density in the range of from about 1.5 to 3.0 J/cm$^2$, and a duration in the range of from about 20 to 50 nanoseconds and (b) Q-switched YAG laser-generated pulses having a wavelength of 1.06 μm, an energy density in the range of from about 5 to 7 J/cm$^2$, and a duration in the range of from about 80 to 120 nanoseconds to effect melting of said layer.

2. The process of claim 1 wherein said defects comprise precipitated dopant atoms.

3. The process of claim 1 wherein said substrate is n-type silicon and said impurity is a donor element.

4. The process of claim 1 wherein said substrate is p-type silicon and said impurity is an acceptor element.

5. In a process wherein an impurity is thermally diffused into a surface layer of a crystalline silicon substrate to form an electrical junction therein, the improved method for eliminating precipitates of said impurity in said layer without degrading the minority-carrier diffusion length in said layer, said method comprising:
   determining the depth to which said precipitates extend in said layer, and
   irradiating said layer with at least one laser pulse selected from one of (a) Q-switched ruby laser-generated pulses having a wavelength of 0.694 μm, an energy density in the range of from about 1.5 to 3.0 J/cm$^2$, and a duration in the range of from about 20 to 50 nanoseconds and (b) Q-switched YAG laser-generated pulses having a wavelength of 1.06 μm, an energy density in the range of from about 5 to 7 J/cm$^2$, and a duration in the range of from about 80 to 120 nanoseconds to effect melting of said layer to at least said depth.

6. The process of claim 5 wherein said substrate is p-type silicon and said impurity is an acceptor element.

7. The process of claim 5 wherein said substrate is n-type silicon and said impurity is a donor element.

8. A method for treating a surface layer of junction free silicon semiconductor material, said layer having dispersed therein an impurity selected from the group consisting of copper and iron to effect segregation of said impurity in a near-surface portion of said layer, said method comprising:
   irradiating said layer with at least one laser pulse selected from one of (a) Q-switched ruby laser-generated pulses having a wavelength of 0.694 μm, an energy density in the range of from about 1.5 to 3.0 J/cm$^2$, and a duration in the range of from about 20 to 50 nanoseconds and (b) Q-switched YAG laser-generated pulses having a wavelength of 1.06 μm, an energy density in the range of from about 5 to 7 J/cm$^2$, and a duration in the range of from about 80 to 120 nanoseconds to effect melting of said layer.

9. The method of claim 8 further characterized by the step of removing from said layer the portion thereof containing the impurity so segregated.

* * * * *